United States Patent
Rofougaran

(10) Patent No.: US 8,428,646 B2
(45) Date of Patent: *Apr. 23, 2013

(54) METHOD AND SYSTEM FOR SOFTWARE DEFINED POWER AMPLIFIER FOR MULTI-BAND, MULTI-STANDARD APPLICATIONS

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/411,869

(22) Filed: Mar. 5, 2012

(65) Prior Publication Data

US 2012/0164963 A1 Jun. 28, 2012

Related U.S. Application Data

(63) Continuation of application No. 11/678,990, filed on Feb. 26, 2007, now Pat. No. 8,130,735.

(51) Int. Cl.
*H04M 88/06* (2006.01)
*H04W 84/12* (2009.01)

(52) U.S. Cl.
USPC .................................. 455/552.1; 370/338

(58) Field of Classification Search ............... 455/552.1, 455/114.2, 127.3, 343.1; 330/136, 2, 302, 330/253, 51, 297; 326/83, 62
See application file for complete search history.

(56) References Cited

U.S. PATENT DOCUMENTS

| 8,130,735 | B2 | 3/2012 | Rofougaran | |
| 2006/0030277 | A1* | 2/2006 | Cyr et al. | 455/77 |
| 2007/0096823 | A1 | 5/2007 | Wang et al. | |
| 2007/0249388 | A1* | 10/2007 | Sorrells et al. | 455/552.1 |

* cited by examiner

Primary Examiner — Kiet Doan
(74) Attorney, Agent, or Firm — Thomas|Horstemeyer, LLP

(57) ABSTRACT

Methods and systems for a software defined power amplifier for multi-band, multi-standard applications are disclosed and may comprise configuring a single programmable output stage of a multi-band, multi-standard transmitter to handle transmission of a signal according to multiple wireless communication protocols and frequency ranges. The output stage may be configured by coupling a power amplifier (PA) within the programmable output stage to a switch or a duplexer, which may be coupled to one or more of multiple antennas, each of which may handle signals in a different frequency range. Each antenna may be impedance matched with the power amplifier using transformers, and may be coupled by activating at least one integrated transistor. The PA may be biased to operate in one of a plurality of classes of operation comprising Class A, AB, C and F associated with the wireless communication protocols, which may comprise EDGE, GSM, WCDMA and wireless LAN.

14 Claims, 5 Drawing Sheets

METHOD AND SYSTEM FOR SOFTWARE DEFINED POWER AMPLIFIER FOR MULTI-BAND, MULTI-STANDARD APPLICATIONS

CROSS-REFERENCE TO RELATED APPLICATIONS/INCORPORATION BY REFERENCE

This application is a continuation of U.S. patent application Ser. No. 11/678,990, filed Feb. 26, 2007, and makes reference to:
U.S. Pat. No. 7,729,683, filed on Feb. 26, 2007;
U.S. Pat. No. 7,616,941, filed on Feb. 26, 2007;
U.S. patent application Ser. No. 11/678,894, filed on Feb. 26, 2007; and
U.S. patent application Ser. No. 11/679,003, filed on Feb. 26, 2007.

Each of the above stated applications is hereby incorporated herein by reference in its entirety.

FEDERALLY SPONSORED RESEARCH OR DEVELOPMENT

Not Applicable

MICROFICHE/COPYRIGHT REFERENCE

Not Applicable

FIELD OF THE INVENTION

Certain embodiments of the invention relate to power amplifiers. More specifically, certain embodiments of the invention relate to a method and system for a software defined power amplifier for multi-band, multi-standard applications.

BACKGROUND OF THE INVENTION

A power amplification circuit in a wireless system is typically a large signal device. In wireless local area network (WLAN) systems, the power amplifier (PA) circuit may be required to transmit output signals at power levels ranging from −50 dBm to +30 dBm, for example. In such WLAN systems, which may, for example, utilize a wide range of modulation types from binary phase shift keying (BPSK) to 512 level quadrature amplitude modulation (512-QAM), output power levels may vary widely such that the ratio of the peak power level to the average power level may be large, for example, 10 dBm to 15 dBm.

The power output of a PA may be affected by the impedance of the antenna. The output impedance of a properly designed PA is matched to the impedance of the antenna. If for some reason the antenna impedance changes, this may cause a reflection in the signal at the antenna back to the PA, which is known as voltage standing wave ratio (VSWR). For example, if a hand or other object is placed on an antenna, the impedance of the antenna may change. With a VSWR of greater than 1, the output power of the PA may vary as gain control circuitry attempts to compensate for the output voltage swing due the reflected signal. One current approach utilized in an attempt to reduce VSWR is with external discrete directional couplers.

Limitations in the performance of PA circuitry may be exacerbated when the PA is integrated in a single integrated circuit (IC) device with other radio frequency (RF) transmitter circuitry [such as digital to analog converters (DAC), low pass filters (LPF), mixers, and RF programmable gain amplifiers (RFPGA)]. Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification. Requirements for AM-AM and/or AM-PM distortion levels as set forth in a WLAN standard, such as IEEE 802.11, may preclude transmitting output signals at high output power levels for PA circuitry that is fabricated utilizing a 65 nm CMOS process, for example.

Wireless systems are typically designed to function at a specific frequency, 900 MHz or 1.8 GHz, for example, and utilizing a defined standard such as GSM, WCDMA, EDGE, for example. Thus, wireless systems have to be designed for a specific application with device performance optimized for that application.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a software defined power amplifier for multi-band, multi-standard applications, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a software defined power amplifier for multi-band, multi-standard applications. Exemplary aspects of the invention include configuring a single programmable output stage of a transmitter to handle transmission of a signal according to multiple wireless communication protocols and frequency ranges. The output stage may be configured by coupling a power amplifier (PA) within the programmable output stage to a switch or a duplexer, which may be coupled to one of multiple antennas, each of which may handle signals in a different frequency range. Each antenna may be impedance matched with the power amplifier using transformers, and may be coupled by activating at least one integrated transistor. The PA may be biased to operate in one of a plurality of classes of operation comprising Class A, AB, C and F associated with the wireless communication protocols, which may comprise EDGE, GSM, WCDMA and wireless LAN, for example.

Figure 1A:
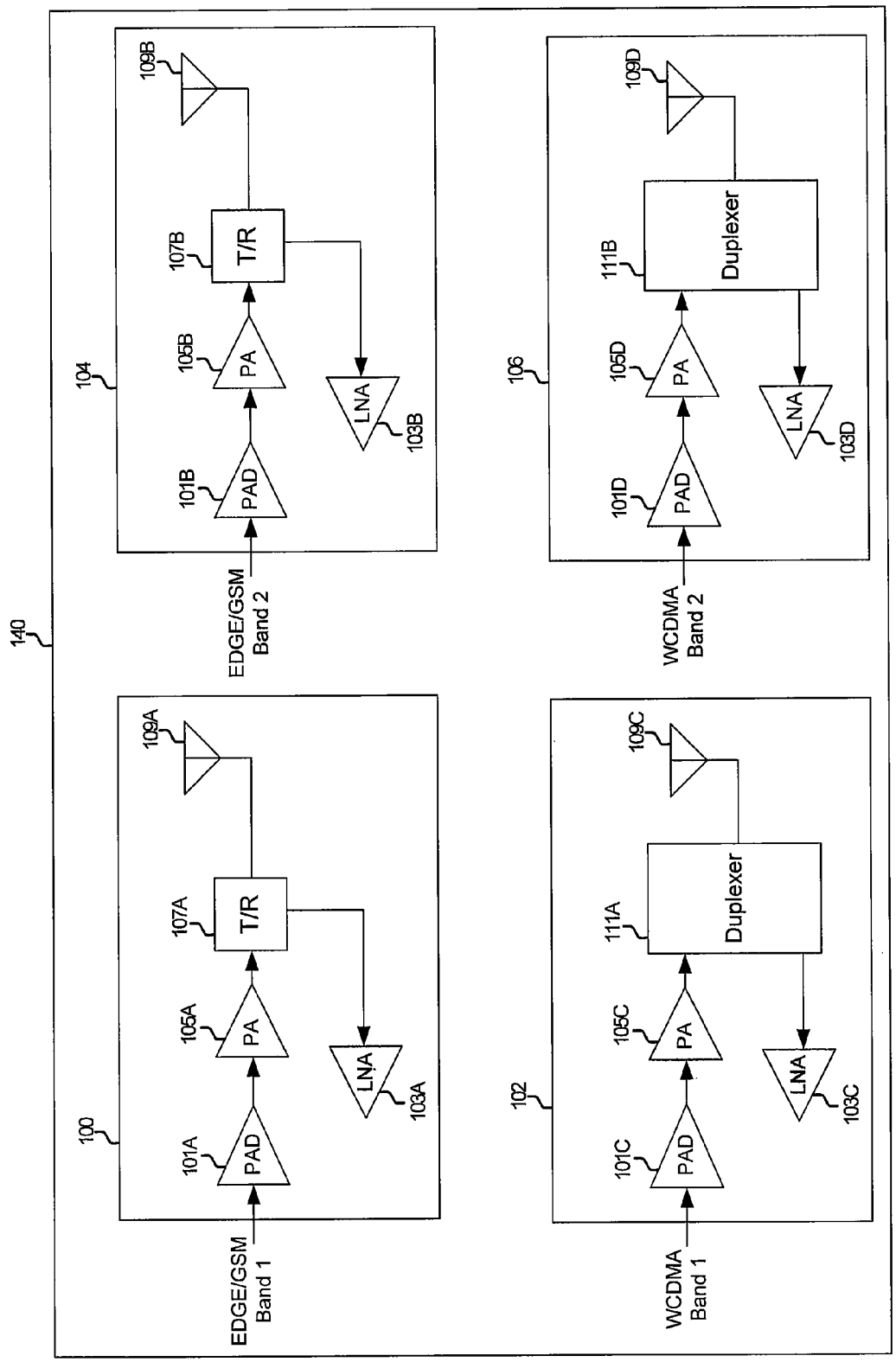
FIG. 1A is a block diagram illustrating exemplary transmitter output stages for different frequency bands and standards, in connection with an embodiment of the invention.

FIG. 1A is a block diagram illustrating exemplary transmitter output stages for different frequency bands and standards, in connection with an embodiment of the invention. Referring to FIG. 1A, there is shown mobile terminal 140 comprising transmitter output stages 100, 102, 104 and 106. The output stage 100 may comprise a power amplifier driver (PAD) 101A, a power amplifier (PA) 105A, a low noise amplifier (LNA) 103A, a transmit/receive (T/R) switch 107A and an antenna 109A.

The PAD 101A may comprise suitable circuitry, logic and/or code that may enable receiving of analog input signals and generating an output signal for driving a power amplifier. The PAD 101A may receive as inputs, control signals, which may be generated by a baseband processor, not shown. The received control signal may be utilized to set a gain or attenuation level of the PAD 101A. The PAD 101A may be enabled to receive the output signal generated by the baseband stages of the transmitter. The PAD 101A may be enabled to generate an output signal that may be communicated to the PA 105A.

The PA 105A may comprise suitable circuitry, logic and/or code that may enable amplification of input signals to generate a transmitted signal of sufficient signal power (as measured by dBm, for example) for transmission via a wireless communication medium. The PA 105A may receive as inputs, control signals, which may be generated by a baseband processor. The received control signal may be utilized to set a gain or attenuation level of the PA 105A.

The LNA 103A may comprise suitable circuitry, logic and/or code that may enable amplification of received signals to generate a signal of sufficient signal for processing by subsequent stages of a receiver circuit, not shown. The LNA 103A may receive a signal received by the antenna 109A via the T/R switch 107A.

The T/R switch 107A may comprise suitable circuitry, logic and/or code that may enable switching the antenna 109A between receiving a signal from the PA 105A and communicating a signal to the LNA 103A. The antenna 109A may comprise suitable circuitry for transmitting an RF signal.

In operation, the output stage 100 may enable receiving of an analog input signal and applying an appropriate gain to the signal such that the power transmitted by the antenna 109A may be at a desired level. The input signal may be at a particular frequency for which the output stage 100 may be designed. The signal may be communicated to the PAD 101A, which may provide gain or attenuation at a level determined by the required signal to be transmitted by the antenna 109A. The output signal of the PAD 101A may be communicated to the PA 105A. The PA 105A may provide gain or attenuation at a level determined by the required signal to be transmitted by the antenna 109A. The output signal of the PA 105A may be communicated to the input of the T/R switch 107A. The T/R switch 107A may couple the antenna 109A to the PA 105A when in transmit mode, or the LNA 103A, when in receive mode. In transmit mode, the T/R switch 109A may couple the PA 105A to the antenna 109A, such that the output signal received from the PA 105A may be transmitted by the antenna 109A.

The output stage 104 may be substantially similar to the output stage 100, but may be designed to transmit and receive at a different frequency. The amplifier blocks, PAD 101 B, 101C and 101 D, and PA 105A, 105B, 105C and 105D may function only at a frequency defined by the load impedances of each stage, thus illustrating the limitation of conventional systems: for any desired frequency, a different output stage may be required.

The output stages 102 and 106 may be substantially similar to the output stages 100 and 104 except that the T/R switches 107A and 107B may be replaced by duplexers 111A and 111B. In this manner, the output stages 102 and 106 may be utilized in WCDMA applications. The duplexers 111A and 111 B may comprise suitable circuitry, logic and/or code for enabling two-way communication via the antennas 109C and 109D, respectively. The remaining components of the output stages 102 and 106 may be substantially similar to the associated components of output stages 100 and 104.

In operation, the output stage 102 may enable receiving of an analog input signal and applying an appropriate gain to the signal such that the power transmitted by the antenna 109C may be at a desired level. The input signal may be at a particular frequency for which the output stage 102 may be designed, Band 1, for example. The signal may be communicated to the PAD 101C, which may provide gain or attenuation at a level determined by the required signal to be transmitted by the antenna 109C. The output signal of the PAD 101C may be communicated to the PA 105C. The PA 105C may provide gain or attenuation at a level determined by the required signal to be transmitted by the antenna 109C. The output signal of the PA 105C may be communicated to the input of the duplexer 111A. The duplexer 111A may couple the PA 105C and the LNA 103C to the antenna 109C to allow for both transmission and reception.

The output stage 106 may be substantially similar to the output stage 102, but may be designed to transmit and receive at a different frequency. The amplifier blocks, PAD 101 B, 101C and 101 D, and PA 105A, 105B, 105C and 105D may function at a frequency defined by the load impedances of each stage, thus illustrating the limitation of conventional systems: for any desired frequency utilizing a particular standard, a different output stage may be required.

Figure 1B:
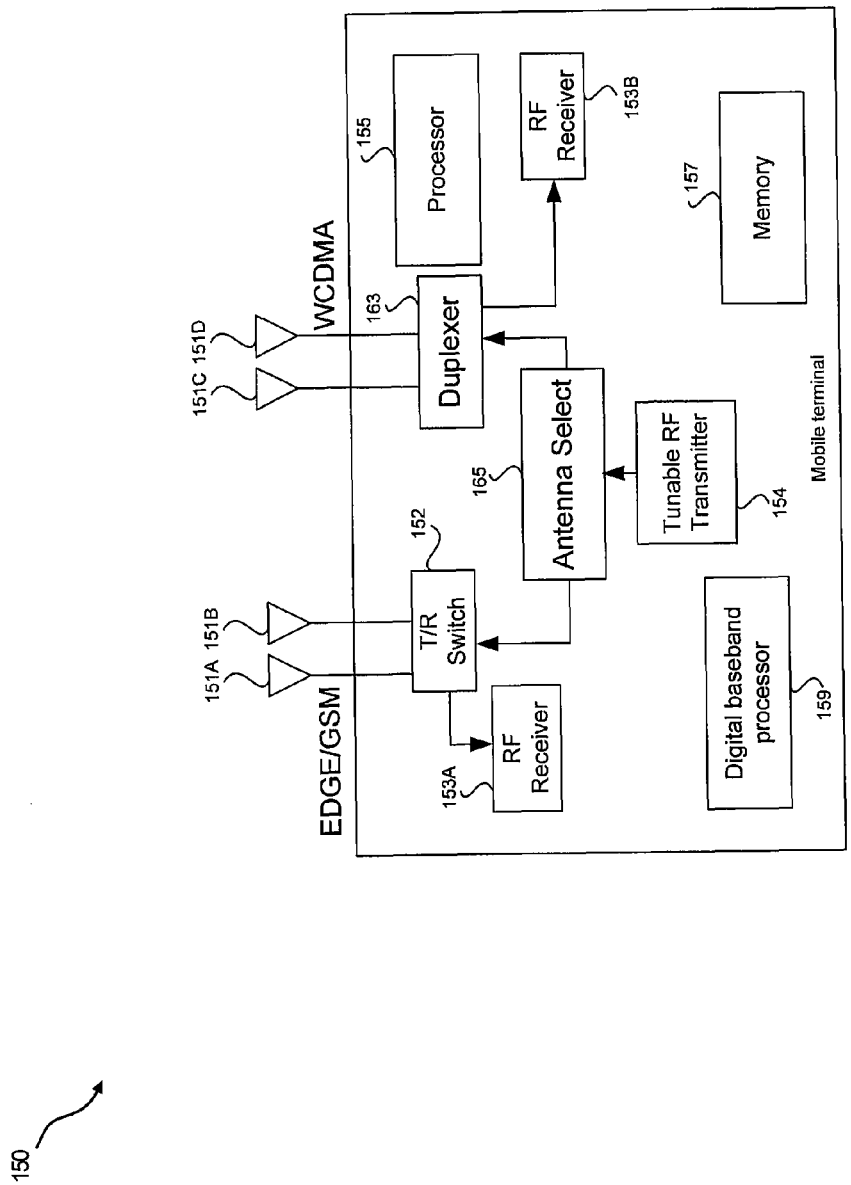
FIG. 1B is a block diagram of an exemplary multi-band mobile terminal, which may utilize a single tunable output stage with selectable antennas, in accordance with an embodiment of the invention.

FIG. 1B is a block diagram of an exemplary multi-band mobile terminal, which may utilize a single tunable output stage with selectable antennas, in accordance with an embodiment of the invention. Referring to FIG. 1B, there is shown mobile terminal 150 that may comprise RF receivers 153A and 153B, a tunable RF transmitter 154, a T/R switch 152, a digital baseband processor 159, a processor 155, a memory 157, a duplexer 163, an antenna select block 165 and antennas 151A, 151B, 151C and 151D. One or more of the antennas 151A, 151B, 151C and/or 151D may be communicatively coupled to the T/R switch 152 or the duplexer 163, wherein each antenna may be designed for a specific frequency range. The antenna select block 165 may couple an appropriate output of the tunable transmitter 154 to an antenna on the mobile terminal 150, depending on the frequency requirements of the system. The T/R switch 152 may be utilized in applications where full duplex operation is not required. In instances where the T/R switch 152 is set to "R", or receive, the antenna 151A and/or 151B may be communicatively coupled to the RF receiver 153A, and in instances when the T/R switch 152 is set to "T", or transmit, the antenna 151A and/or 151B may be communicatively coupled to the tunable RF transmitter 154. The T/R switch 152 may comprise a plurality of T/R switches in instances where multiple frequency bands may be desired.

The RF receivers 153A and 153B may comprise suitable logic, circuitry, and/or code that may enable processing of received RF signals. The RF receivers 153A and 153B may enable receiving of RF signals in frequency bands utilized by various wireless communication systems, such as Bluetooth, WLAN, GSM, and/or WCDMA, for example. Systems requiring full duplex mode may utilize the RF receiver 153B, and systems not requiring full duplex may utilize the RF receiver 153A.

The digital baseband processor 159 may comprise suitable logic, circuitry, and/or code that may enable processing and/or handling of baseband signals. In this regard, the digital baseband processor 159 may process or handle signals received from the RF receiver 153A and/or signals to be transferred to the tunable RF transmitter 154 for transmission via a wireless communication medium. The digital baseband processor 159 may also provide control and/or feedback information to the RF receivers 153A and 153B and to the tunable RF transmitter 154, based on information from the processed signals. The digital baseband processor 159 may communicate information and/or data from the processed signals to the processor 155 and/or to the memory 157. Moreover, the digital baseband processor 159 may receive information from the processor 155 and/or the memory 157, which may be processed and transferred to the RF transmitter 154 for transmission to the wireless communication medium.

The tunable RF transmitter 154 may comprise suitable logic, circuitry, and/or code that may enable processing of RF signals for transmission. The tunable RF transmitter 154 may enable transmission of RF signals in frequency bands utilized by various wireless communications systems, such as Bluetooth, WLAN, GSM and/or WCDMA, for example, and as such may be frequency tunable and standard selectable.

The processor 155 may comprise suitable logic, circuitry, and/or code that may enable control and/or data processing operations for the mobile terminal 150. The processor 155 may be utilized to control at least a portion of the RF receivers 153A and 153B, the tunable RF transmitter 154, the digital baseband processor 159, and/or the memory 157. In this regard, the processor 155 may generate at least one signal for controlling operations within the mobile terminal 150.

The memory 157 may comprise suitable logic, circuitry, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal 150. For example, the memory 157 may comprise information necessary to configure the RF receivers 153A and/or 153B to enable receiving RF signals in the appropriate frequency band.

The antenna select block 165 may comprise suitable circuitry, logic and/or code for selectively coupling the signal generated by the tunable RF transmitter 154 to the appropriate antenna 151A, 151B, 151C, and/or 151D via the T/R switch 152 or the duplexer 163. The antenna select block 165 may comprise an addressable array of transistors, for example, to switch between the antennas 151A, 151B, 151C, and/or 151D.

The duplexer 163 may comprise suitable circuitry, logic and/or code for combining two signals, the output generated by the tunable RF transmitter 154 and the signal received by the antenna 151C and/or 151D via the antenna select block 165, into one such that communication may be transmitted and received on the same antenna concurrently. The duplexer 163 may comprise a plurality of duplexers in instances where multiple frequency bands may be desired, and may be utilized in applications, such as WCDMA, for example, where full duplex communication may be required.

In operation, the tunable RF transmitter 154 may be enabled to generate an amplified RF signal. Depending on the wireless communication standard being utilized, the signal may be communicated to the duplexer 163 or the T/R switch 152 via the antenna select block 165. The duplexer 163 may enable two-way communication of signals, for example the signal generated by the tunable RF transmitter 154 to the antenna 151C and/or 151D and the signal received by the selected antenna or antennas 151C and/or 151D to the RF receiver 153B.

In another embodiment of the invention, in instances where duplex communication may not be required, the signal generated by the tunable RF transmitter 154 may be communicated to the selected antenna or antennas 151A and/or 151B via the T/R switch 152 and the antenna select block 165.

Figure 2:
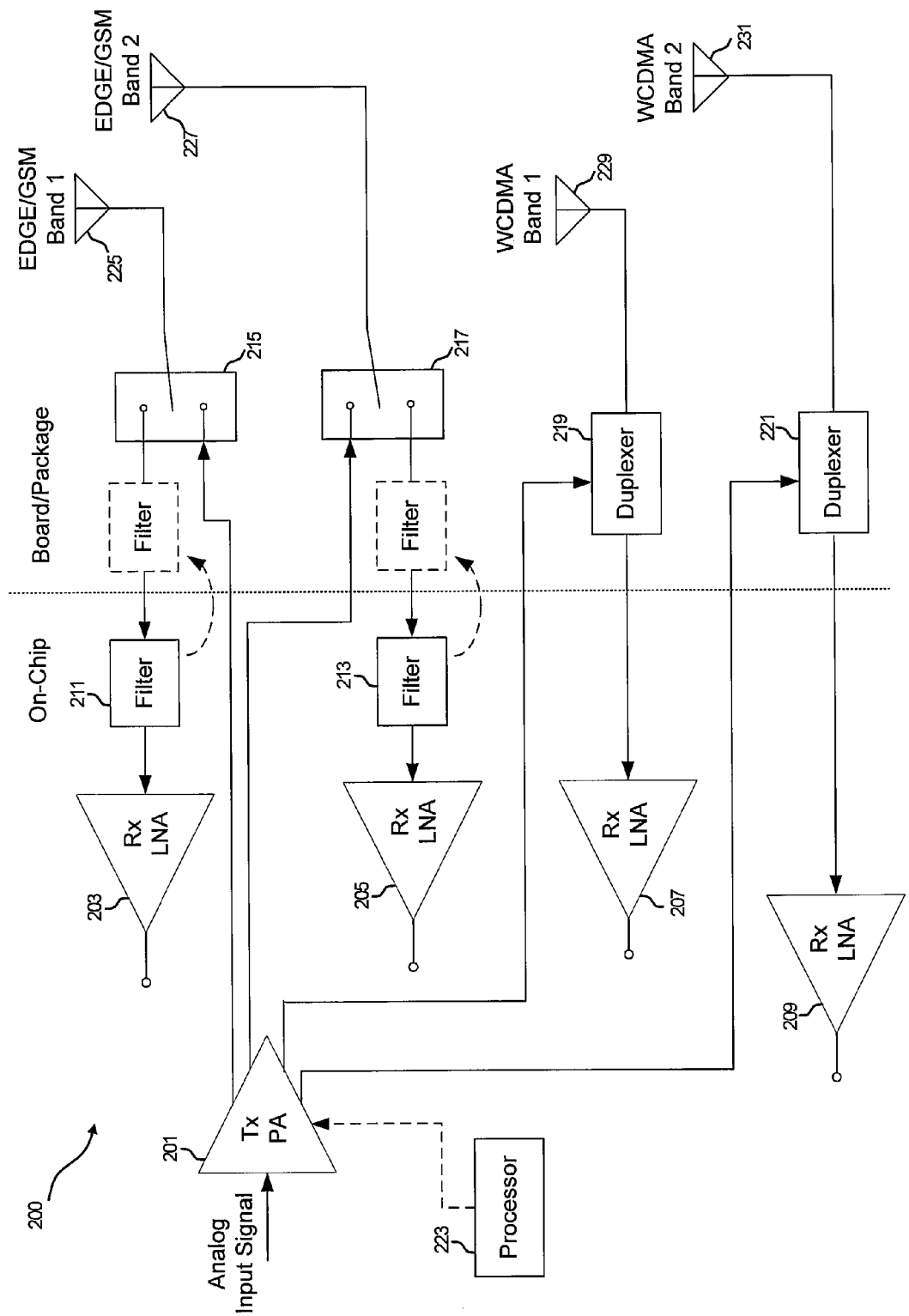
FIG. 2 is a block diagram of an exemplary output stage illustrating multi-band multi-standard capability, in accordance with an embodiment of the invention.

FIG. 2 is a block diagram of an exemplary output stage illustrating multi-band multi-standard capability, in accordance with an embodiment of the invention. Referring to FIG. 2, there is shown an output stage 200 comprising a PA 201, LNAs 203, 205, 207 and 209, duplexers 219 and 221, filters 211 and 213, T/R switches 215 and 217, a processor 223 and antennas 225, 227, 229 and 231. The PA 201, the LNAs 203, 205, 207 and 209, the processor 223 and the filters 211 and 213 may be integrated on-chip, while the remaining components may be integrated on a circuit board or package. In another embodiment of the invention, the filters 211 and 213 may be off-chip, integrated on a circuit board or package, as indicated in FIG. 2 by the dashed line arrows and filter blocks.

The PA 201 may comprise suitable circuitry, logic and/or code that may enable amplification of input signals to generate a transmitted signal of sufficient signal power (as measured by dBm, for example) for transmission via a wireless communication medium. The PA 201 may receive as inputs, control signals, which may be generated by the processor 223. The received control signal may be utilized to set a gain or attenuation level of the PA 201. The PA 201 may receive an analog input signal and provide a gain level as determined by the output signal desired at the antenna 225, 227, 229 and/or 231, and may be enabled to generate an output signal at one of a plurality of frequencies, as described further with respect to FIG. 3. The gain level may be determined depending on the desired application standard or wireless communication protocol, such as GSM, EDGE, or WCDMA, for example, which may determine the class of operation, Class A, Class AB, Class C, and/or Class F, for example.

The processor 223 may comprise suitable logic, circuitry, and/or code that may enable processing of binary data contained within an input baseband signal. The processor 223 may perform processing tasks, which correspond to one or more layers in an applicable protocol reference model (PRM). For example, the processor 223 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the processor 223 may be referred to as being within the digital domain. The processor 223 may also generate control signals to control the PA 201 based on the processing of the input binary data.

The LNA 203 may comprise suitable circuitry, logic and/or code that may enable amplification of received signals to generate a signal of sufficient strength for processing by subsequent stages of a receiver circuit, not shown. The LNA 203 may receive a signal generated by the filter 211. The LNAs 205, 207 and 209 may be substantially similar to the LNA 203. The LNA 205 may receive a signal generated by the filter 213. The LNA 207 may be enabled to receive a signal generated by the duplexer 219, and the LNA 209 may be enabled to receive a signal generated by the duplexer 221.

The filter 211 may comprise suitable circuitry, logic and/or code that may enable filtering of the signal received by the antenna 225 and communicated via the T/R switch 215 to the filter 211. The filter 211 may comprise a band-pass filter designed to pass a desired frequency while attenuating signals not at the desired frequency. The filters 211 and 213 may be integrated on-chip, or on the circuit board or package as indicated by the dashed line arrows and filter blocks. The filter 213 may be substantially similar to the filter 211, but configured for a different frequency band, and enabled to filter a signal received by the antenna 227 and communicated to the filter 213 via the T/R switch 217.

The T/R switch 215 may comprise suitable circuitry, logic and/or code that may enable switching of the antenna 225 between receiving a signal from the PA 201 and communicating a received signal to the filter 211. The T/R switch 217 may be substantially similar to the T/R switch 215, and may be enabled to switch the antenna 227 between receiving a signal from the PA 201 and communicating a received signal to the filter 213. The antennas 225, 227, 229 and 231 may comprise suitable circuitry for transmitting and receiving an RF signal. Each antenna may be designed to transmit at a particular frequency and the impedance of each antenna may match the output impedance of the PA via impedance matching transformers, not shown in FIG. 2, but described with respect to FIG. 3. The antennas 225 and 229 may be designed for one frequency, Band 1, for example, whereas the antennas 227 and 231 may be designed for another frequency, Band 2, for example. The various embodiments of the invention are not limited in the number of frequency bands illustrated in FIG. 2. Accordingly, any number of frequency bands may be used depending on, for example, the frequency requirements of the system.

The duplexer 219 may comprise suitable circuitry, logic and/or code that may enable combining a plurality of signals, such as the output generated by the PA 201 and the signal received by the antenna 229, in this example, into one such that communication may be transmitted and received on the same antenna concurrently. The duplexer 219 may be utilized in applications, such as WCDMA, for example, where full duplex communication may be required. The duplexer 221 may be substantially similar to the duplexer 219, and may be enabled to combine a plurality of signals, such as the output generated by the PA 201 and the signal received by the antenna 231.

In operation, the PA 201 may receive an analog input signal and apply an appropriate gain as required by a control signal generated by the processor 223. In instances where the output stage 200 may be utilized in a WCDMA application, the duplexer 219 may be enabled to allow two-way communication by receiving an output signal generated by the PA 201 and the signal received by the antenna 229. The duplexer 219 may communicate the signal received from the antenna 229 to the LNA 207, and may communicate the signal received from an output of the PA 201 to the antenna 229. If a different frequency band may be required, the duplexer 221 may be enabled to allow two-way communication by receiving an output signal generated by the PA 201 and the signal received by the antenna 231. The duplexer 221 may communicate the signal received from the antenna 231 to the LNA 209, and may communicate the signal received from an output of the PA 201 to the antenna 231.

In instances where full duplex communication is not required, such as with EDGE/GSM, for example, an output signal generated by the PA 201 may be communicated to the T/R switch 215. When the T/R switch 215 is in transmit mode, a signal generated by the PA 201 may be communicated to the antenna 225. When the T/R switch 215 is in receive mode, a signal received by the antenna 225 may be communicated to the LNA 203 via the filter 211. In instances where EDGE/GSM signals may be required at a different frequency, Band 2, for example, an output signal generated by the PA 201 may be communicated to the T/R switch 217. When the T/R switch 217 is in transmit mode, a signal generated by the PA 201 may be communicated to the antenna 227. When the T/R switch 217 is in receive mode, a signal received by the antenna 227 may be communicated to the LNA 205 via the filter 213.

In this manner, a single PA, such as the PA 201 in this example, may be utilized to operate at multiple frequencies, Band 1 and Band 2, and under multiple standards or wireless communication protocols, EDGE/GSM and/or WCDMA, for example. The PA may be biased in different classes of operation based on the wireless communication protocol.

A power amplifier (PA) circuit may be biased for different modes, or "classes" of operation. For example, in Class A operation, a PA may be biased such that the PA is in a conducting, or ON, state during 100% of the cycle, or the entire cycle, of the input signal. The bias level is also typically selected such that the PA operates in the most linear portion of the transfer curve, which characterizes the PA circuit. In Class A operation, the output signal from the PA is typically a scaled version of the input signal, where the scaling factor is a function of the gain associated with the PA circuit. However, because of the bias level utilized for Class A operation, the PA is typically in a conducting state even when there is no input signal. Furthermore, even when the PA is amplifying an input signal, the efficiency of the PA may not exceed 50%. For example, each watt of delivered output power, or Pout, may require two (2) watts of delivered power, PDC, from a DC power supply source (such as a battery).

In Class B operation, a PA may be biased such that the PA is in a conducting state during 50%, or half, of the cycle of the input signal. This may result in large amounts of distortion of the input signal in the output signal. In this regard, in Class B operation, the PA may operate in a nonlinear portion of the transfer curve. However, the theoretical efficiency of a Class B PA circuit may reach 78.5%. The higher efficiency of the Class B PA results from the PA being in a non-conducting, or OFF, state half of the time. While the PA is in the OFF state, power dissipation may be theoretically zero (0).

In Class AB operation, a PA may be biased such that the PA is in a conducting state for greater than 50%, but less than 100%, of the cycle of the input signal. In Class C operation, a PA may be biased such that the PA is in a conducting state for less than 50% of the cycle of the input signal.

Figure 3:
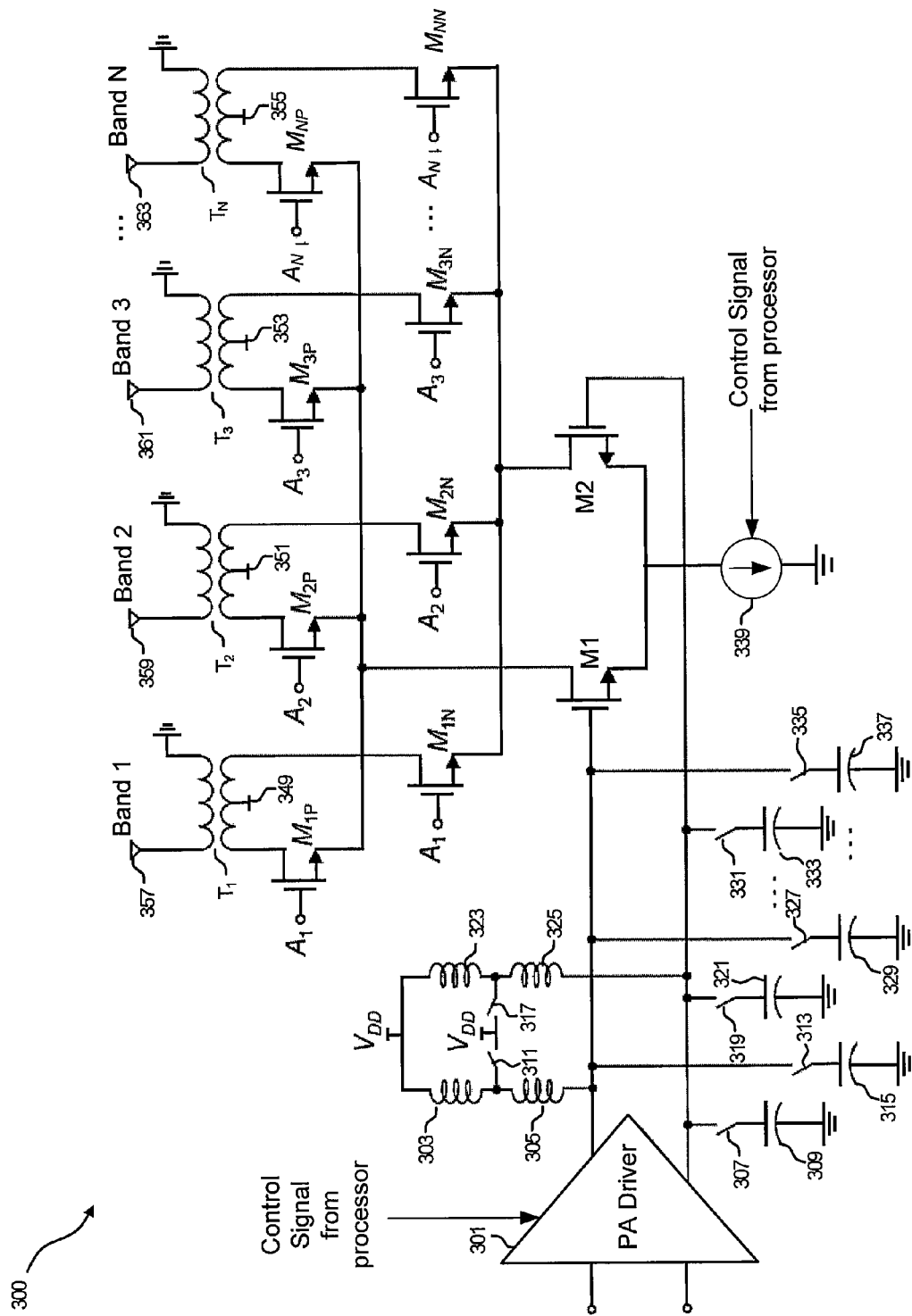
FIG. 3 is a block diagram of exemplary tunable output stage circuitry, in accordance with an embodiment of the invention.

FIG. 3 is a block diagram of exemplary tunable output stage circuitry, in accordance with an embodiment of the invention. Referring to FIG. 3, there is shown tunable output stage 300 comprising a PAD 301, inductors 303, 305, 323 and 325, capacitors, 309, 315, 321, 329, 333 and 337, switches 307, 311, 313, 317, 319, 327, 331 and 335, a current source 339, transformers $T_1$, $T_2$, $T_3$ and $T_N$, transformer center taps 349, 351, 353 and 355, antennas 357, 359, 361 and 363, power amplifier transistors M1, M2 and band switching transistors $M_{1N}$, $M_{1P}$, $M_{2N}$, $M_{2P}$, $M_{3N}$, $M_{3P}$, $M_{NN}$, and $M_{NP}$.

The inductors 303, 305, 323 and 325, capacitors, 309, 315, 321, 329, 333 and 337, and switches 307, 311, 313, 317, 319, 327, 331 and 335, may comprise a tuning circuit that may be configured to pass a signal of a desired frequency from the PAD 301 to the power amplifier transistors M1 and M2. The frequency may be configured by closing appropriate switches. For example, by closing switches 311 and 317, the inductors 303 and 323 may be bypassed as they are shorted out with the bias voltage, $V_{DD}$, applied at both ends. In this regard, the inductance may be the parallel combination of the inductors 305 and 325. In the same manner, closing any of the switches for the capacitors may result in the parallel combination of the selected capacitors. The various embodiments of the invention are not limited to the number of inductors and capacitors shown in FIG. 3. Accordingly, any number may be used depending on, for example, the frequency requirements of the system.

The selection of the inductors and capacitors may be made in conjunction with the selection of the appropriate antenna. The antennas 357, 359, 361 and 363 may each be tuned to operate at a specific frequency range, as indicated by Band 1, Band 2, Band 3 up to Band N. The antenna may be selected by providing a signal, $A_1$, $A_2$, $A_3$ and $A_N$ from a processor such as the processor 223 described with respect to FIG. 2, to the appropriate transistors, $M_{1N}$, $M_{1P}$, for the antenna 357, or $M_{2N}$, $M_{2P}$, for the antenna 359, for example. In one embodiment of the invention, the transistors $M_{1N}$, $M_{1P}$, $M_{2N}$, $M_{2P}$, $M_{3N}$, $M_{3P}$, $M_{NN}$, and $M_{NP}$ are n-channel MOSFETs, which may be switched on by applying a high bias at the gate terminal of the transistor. Thus, to transmit a signal in Band 3 utilizing the antenna 361, $A_3$ may be asserted high while $A_1$, $A_2$ and $A_N$ may be asserted low.

The impedance of the antennas 357, 359, 361 and 363 may be matched to the output impedance of the amplifier comprising the power amplifier transistors M1 and M2 and associated band switching transistors $M_{1N}$, $M_{1P}$, $M_{2N}$, $M_{2P}$, $M_{3N}$, $M_{3P}$, $M_{NN}$, and $M_{NP}$ via the transformers $T_1$, $T_2$, $T_3$ and $T_N$. For power amplifier applications, the output transistors, such as the power amplifier transistors M1 and M2, may have a large area to handle the high power levels required of them, thus their output impedance may be low, on the order of a few ohms, for example. To match the output impedance of the circuit utilized for Band 3, for example, comprising transistors M1, M2, $M_{3N}$, $M_{3P}$, with that of the antenna 361, which may 50 ohms, for example, the transformer $T_3$ may be designed with a number of turns to step-up the impedance appropriately.

The current source 339 may comprise suitable circuitry, logic and/or or code that may be enabled to supply current to the power amplifier transistors M1 and M2 and the combination of $M_{1N}$ and $M_{1P}$, $M_{2N}$ and $M_{2P}$, $M_{3N}$ and $M_{3P}$, up to $M_{NN}$, and $M_{NP}$. In one embodiment of the invention, the current source may comprise a series of parallel-connected current mirrors of varying current capacity. By selecting appropriate current mirrors using a processor, such as the processor 223 described with respect to FIG. 2, the biasing conditions of the circuit may be adjusted, thus controlling the transmitted power of the tunable output stage 300.

In accordance with an embodiment of the invention, the biasing conditions of the tunable output stage 300 may be adjusted by varying the voltage applied to the transformer center taps 349, 351, 353 and 355. Since an inductor may simply be a short circuit at DC, this applied voltage may represent the bias voltage for the power amplifier comprising M1, M2 and the appropriate transistors $M_{1N}$ and $M_{1P}$, $M_{2N}$ and $M_{2P}$, $M_{3N}$ and $M_{3P}$, or $M_{NN}$, and $M_{NP}$. The bias voltage may be adjusted by a DC to DC converter, for example, controlled by a processor, such as the processor 223, described with respect to FIG. 2.

In operation, a frequency band to be transmitted by the tunable output stage 300 may be selected by a processor, such as the processor 223, described with respect to FIG. 2. The selected frequency may determine which capacitors 309, 315, 321, 329, 333 and/or 337 and which inductors 303, 305, 323 and/or 325 may be switched into the circuit, and which antenna 357, 359, 361 and/or 363 may be activated. The PAD 301 may receive an input signal at the selected frequency and provide appropriate gain determined by the above-mentioned processor.

The tuning circuit may be configured such that the capacitors and inductors switched on may generate a frequency response that passes a signal at the appropriate frequency. The signal may then be communicated to the power amplifier transistors M1 and M2. Due to the low impedance of the power amplifier transistors M1 and M2, the current may be high while the voltage may be low. In this manner, the bias voltage requirements applied to the transformer center taps 349, 351, 353 and/or 355 may not be high. The voltage may be stepped up by the transformers $T_1$, $T_2$, $T_3$ and/or $T_N$ resulting in suitable voltage levels on the antenna, such as the antenna 357, 359, 361 and/or 363.

The biasing conditions for the power amplifier transistors M1 and M2, defined by the current source 339 and the voltage applied to the center taps 349, 351, 353 and 355 of the transformers $T_1$, $T_2$, $T_3$ and $T_N$, may determine the class of operation of the amplifier, such as Class A, AB, C, and F for example. The class of operation may be adjusted depending on the standard or wireless communication protocol required for the transmission application, including GSM, WCDMA and/or EDGE, for example.

Figure 4:
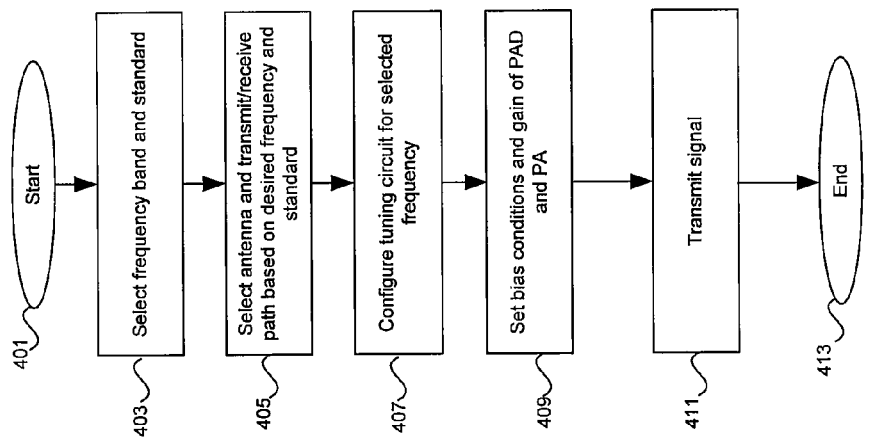
FIG. 4 is a flow diagram illustrating exemplary steps in the control of a tunable output stage with selectable standards and frequency band, in accordance with an embodiment of the invention.

FIG. 4 is a flow diagram illustrating exemplary steps in the control of a tunable output stage with selectable standards and frequency band, in accordance with an embodiment of the invention. Referring to FIG. 4, in step 403 the desired frequency of transmission and communication standard may be selected. In step 405, an appropriate antenna or antennas 225, 227, 229 and/or 231 may be selected that may be designed to transmit at the desired frequency by setting the appropriate band switching transistors, $M_{1N}$ and $M_{1P}$, $M_{2N}$ and $M_{2P}$, $M_{3N}$ and $M_{3P}$, and/or $M_{NN}$, and $M_{NP}$. In step 407, the tuning circuit comprising the inductors 303, 305, 323 and 325, capacitors, 309, 315, 321, 329, 333 and 337, and switches 307, 311, 313, 317, 319, 327, 331 and 335, may be configured to adjust the frequency pass band to center on the desired frequency. In step 409, the gain and bias conditions of the PAD 301 and the PA 201 may be set depending on the desired application standard, such as GSM, EDGE, WCDMA, for example. In step 411, the signal may be transmitted, followed by the end step 413.

In an embodiment of the invention, a single programmable output stage 300 of a transmitter may be configured to handle transmission of a signal according to one of a plurality of wireless communication protocols and frequency ranges, to be handled by the transmitter. The output stage 300 may be configured by coupling a power amplifier (PA) 201 within the programmable output stage to one or more of the T/R switches 215 and 217 or one or more of the duplexers 219 and 221, which may be coupled to one of multiple antennas 225, 227, 229 or 231, each of which may handle signals in a different frequency range. Each antenna 225, 227, 229 and/or 231 may be impedance matched with the power amplifier 201 using the transformers $T_1$, $T_2$, $T_3$ and/or $T_N$ and may be coupled by activating at least one integrated transistor $M_{IN}$, $M_{1P}$, $M_{2N}$, $M_{2P}$, $M_{3N}$, $M_{3P}$, $M_{4N}$, and/or $M_{4P}$. The PA 201 may be biased to operate in one of a plurality of classes of operation comprising Class A, AB, C and F associated with the wireless communication protocols, which may comprise EDGE, GSM, WCDMA and wireless LAN.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method, comprising:
    configuring a single programmable output stage of a multi-band, multi-standard transmitter to handle transmission of a signal according to a selected one of a plurality of wireless communication protocols and a corresponding one of a plurality of frequency ranges associated with said signal, wherein said single programmable output stage comprises switched impedance matching circuits at inputs of a differential pair and a plurality of switched load elements at outputs of said differential pair;
    biasing a power amplifier within said single programmable output stage to operate in one of a plurality of classes of operation associated with said selected one of said plurality of wireless communication protocols;
    configuring said single programmable output stage for said selected one of a plurality of wireless communication protocols by selectively coupling said power amplifier within said single programmable output stage to at least one of a switch or a duplexer; and
    selectively coupling said at least one of a switch or a duplexer to one of a plurality of antennas.

2. The method according to claim 1, wherein said plurality of classes of operation comprises at least one of: class A, class AB, class C or class F.

3. The method according to claim 1, wherein said plurality of antennas handle signals in a different frequency range.

4. The method according to claim 1, wherein each of said plurality of antennas is impedance matched with a respective power amplifier within said single programmable output stage using said switched load elements transformers.

5. The method according to claim 1, further comprising activating at least one integrated transistor for said selective coupling of at least one of said switch or said duplexer to said one of a plurality of antennas.

6. The method according to claim 1, wherein said plurality of wireless communication protocols comprises at least one of: EDGE, GSM, WCDMA or wireless LAN.

7. A system comprising:
    at least one circuit for configuring a single programmable output stage of a multi-band, multi-standard transmitter to handle transmission of a signal according to a selected one of a plurality of wireless communication protocols and a corresponding one of a plurality of frequency ranges associated with said signal;
    where the single programmable output stage comprises switched impedance matching circuits at inputs of a differential pair and a plurality of switched load elements at outputs of said differential pair; and
    where the at least one circuit biases a power amplifier within said single programmable output stage to operate in one of a plurality of classes of operating associated with said selected one of said plurality of wireless communication protocols;
    where the at least one circuit configures said single programmable output stage for said selected one of a plurality of wireless communication protocols by selectively coupling said power amplifier within said single programmable output stage to a switch or a duplexer; and
    the at least one circuit configures said single programmable output stage for said corresponding selected one of said plurality of frequency ranges by selectively coupling at least one of said switch or said duplexer to one of a plurality of antennas.

8. The system of claim 7, wherein said plurality of classes of operating includes at least one of: class A, class AB, class C or class F.

9. The system according to claim 7, wherein each of said plurality of antennas handles signals in a different frequency range.

10. The system according to claim 7, wherein each of said plurality of antennas is impedance matched with a respective power amplifier within said single programmable output stage using said switched load elements transformers.

11. The system according to claim 7, wherein the at least one circuit activates at least one integrated transistor for said selective coupling of at least one of said switch or said duplexer to said one of a plurality of antennas.

12. The system according to claim 7, wherein said plurality of wireless communication protocols comprises at least one of: EDGE, GSM, WCDMA or wireless LAN.

13. A non-transitory machine-readable storage having stored thereon, a computer program having at least one code section executable by a machine, the at least one code section comprising:
- code that configures a single programmable output stage of a multi-band, multi-standard transmitter to handle transmission of a signal according to a selected one of a plurality of wireless communication protocols and a corresponding one of a plurality of frequency ranges associated with said signal;
- code that biases a power amplifier within said single programmable output stage to operate in one of a plurality of classes of operation associated with said selected one of said plurality of wireless communication protocols comprising at least one of: EDGE, GSM, WCDMA or wireless LAN;
- code configures the single programmable output stage for said selected one of a plurality of wireless communication protocols by selectively coupling said power amplifier within the single programmable output stage to at least one of a switch or a duplexer; and
- code that configures said single programmable output stage for said corresponding selected one of said plurality of frequency ranges by selectively coupling at least one of said switch or said duplexer to one of a plurality of antennas; and
- where the single programmable output stage comprises switched impedance matching circuits at inputs of a differential pair and a plurality of switched load elements at outputs of said differential pair.

14. The non-transitory machine readable storage according to claim 13, wherein the computer program further comprises code that configures said single programmable output stage for said selected one of said plurality of wireless communication protocols by selectively coupling said power amplifier within said single programmable output stage to a switch or a duplexer.

* * * * *